(12) United States Patent
Kobuke et al.

(10) Patent No.: US 10,071,932 B2
(45) Date of Patent: Sep. 11, 2018

(54) GLASS CERAMIC SINTERED COMPACT AND WIRING BOARD

(71) Applicant: SNAPTRACK, INC., San Diego, CA (US)

(72) Inventors: Hisashi Kobuke, Tokyo (JP); Yousuke Futamata, Tokyo (JP); Emi Ninomiya, Tokyo (JP)

(73) Assignee: SnapTrack, Inc., San Diego, CA (US)

(*) Notice: Subject to any disclaimer, the term of this patent is extended or adjusted under 35 U.S.C. 154(b) by 0 days.

(21) Appl. No.: 15/574,266

(22) PCT Filed: May 12, 2016

(86) PCT No.: PCT/EP2016/060738
§ 371 (c)(1),
(2) Date: Nov. 15, 2017

(87) PCT Pub. No.: WO2016/188767
PCT Pub. Date: Dec. 1, 2016

(65) Prior Publication Data
US 2018/0134613 A1    May 17, 2018

(30) Foreign Application Priority Data
May 28, 2015 (JP) .................. 2015-108744

(51) Int. Cl.
*H05K 1/00* (2006.01)
*C03C 14/00* (2006.01)
(Continued)

(52) U.S. Cl.
CPC ........ *C03C 14/004* (2013.01); *C03C 10/0045* (2013.01); *H05K 1/0306* (2013.01);
(Continued)

(58) Field of Classification Search
CPC .............. C03C 14/004; C03C 10/0045; C03C 2214/30; C03C 2214/20; C03C 2214/04; C03C 2204/00; H05K 1/0306
(Continued)

(56) References Cited

U.S. PATENT DOCUMENTS 6,232,251 B1 * 5/2001 Terashi ..................... C03C 4/16
257/E23.009
2004/0009863 A1 * 1/2004 Furuse ...................... C03C 8/20
501/5
(Continued)

FOREIGN PATENT DOCUMENTS

JP     2002255645 A    9/2002
JP     2003313074 A    11/2003
(Continued)

OTHER PUBLICATIONS

International Search Report and Written Opinion—PCT/EP2016/060738—ISA/EPO—dated Aug. 3, 2016.

*Primary Examiner* — Sherman Ng
(74) *Attorney, Agent, or Firm* — Patterson & Sheridan, L.L.P. Qualcomm

(57) ABSTRACT

[Problem] The aim of the present invention lies in providing a glass ceramic sintered compact in which dielectric loss in a high-frequency region is reduced, without any reduction in sintering density, and also in providing a wiring board employing same. [Solution] A glass ceramic sintered compact containing a glass component, a ceramic filler and a composite oxide, characterized in that the glass component is crystallized glass on which is deposited a diopside oxide crystal phase including at least Mg, Ca and Si, and the composite oxide includes at least Al and Co.

5 Claims, 5 Drawing Sheets

(51) Int. Cl.
  *C03C 10/00* (2006.01)
  *H05K 1/03* (2006.01)
(52) U.S. Cl.
  CPC ...... *C03C 2204/00* (2013.01); *C03C 2214/04* (2013.01); *C03C 2214/20* (2013.01); *C03C 2214/30* (2013.01)
(58) Field of Classification Search
  USPC .......................................................... 174/258
  See application file for complete search history.

(56) References Cited

U.S. PATENT DOCUMENTS

2004/0167007 A1* 8/2004 Bedard ................. C03C 14/004
  501/32
2006/0040819 A1* 2/2006 Kataoka ................. C03C 3/087
  501/5
2006/0293168 A1 12/2006 Mori et al.
2007/0287012 A1* 12/2007 Kawai ..................... C03C 3/062
  428/427

FOREIGN PATENT DOCUMENTS

JP  2005015284 A  1/2005
JP  4325920 B2  9/2009

* cited by examiner (S1)

Table 2

| No. | Glass Ceramic Compositional Ratio (mass%) | | | | Baking: 920°C, 20 minutes | | | Baking: 920°C, 45 minutes | | | Baking: 920°C, 120 minutes | | |
|---|---|---|---|---|---|---|---|---|---|---|---|---|---|
| | Glass | Filler Alumina | Composite Oxide Composition | Composite Oxide Added Amount | Dielectric Constant (2GHz) | tanδ×10^-4 (2GHz) | Sintered Relative Density (%) | Dielectric Constant (2GHz) | tanδ×10^-4 (2GHz) | Sintered Relative Density (%) | Dielectric Constant (2GHz) | tanδ×10^-4 (2GHz) | Sintered Relative Density (%) |
| Exemplary Embodiment 1 | 66.2 | 31.8 | A | 0.5 | 7.7 | 2.80 | 98.7 | 7.7 | 2.34 | 98.7 | 7.7 | 2.33 | 98.7 |
| Exemplary Embodiment 2 | 66.2 | 31.8 | B | 0.5 | 7.8 | 2.32 | 98.6 | 7.8 | 2.65 | 98.6 | 7.8 | 2.63 | 98.5 |
| Exemplary Embodiment 3 | 66.2 | 31.8 | C | 0.5 | 7.7 | 2.93 | 98.8 | 7.7 | 2.48 | 98.8 | 7.7 | 2.44 | 98.6 |
| Exemplary Embodiment 4 | 66.2 | 31.8 | D | 0.5 | 7.8 | 2.46 | 98.6 | 7.8 | 2.82 | 98.5 | 7.8 | 2.78 | 98.5 |
| Exemplary Embodiment 5 | 66.2 | 31.8 | A | 0.05 | 7.8 | 3.10 | 99.1 | 7.8 | 2.51 | 99.1 | 7.8 | 2.50 | 99.0 |
| Exemplary Embodiment 6 | 66.2 | 31.8 | A | 1.5 | 7.8 | 2.82 | 98.3 | 7.8 | 2.38 | 98.2 | 7.8 | 2.35 | 98.2 |
| Exemplary Embodiment 7 | 61.5 | 39.5 | A | 0.5 | 7.9 | 2.61 | 98.3 | 7.9 | 2.22 | 98.1 | 7.9 | 2.22 | 98.1 |
| Exemplary Embodiment 8 | 75.6 | 24.4 | A | 0.5 | 7.5 | 2.95 | 99.3 | 7.5 | 2.54 | 99.2 | 7.5 | 2.50 | 99.2 |
| Comparative Example 1 | 66.2 | 31.8 | – | – | 7.9 | 5.91 | 98.8 | 7.9 | 4.68 | 98.7 | 7.8 | 3.90 | 98.7 |
| Comparative Example 2 | 66.2 | 31.8 | A | 2.5 | 7.7 | 5.62 | 97.1 | 7.6 | 4.11 | 97.1 | 7.6 | 3.57 | 97.1 |
| Comparative Example 3 | 66.2 | 31.8 | E | 0.5 | 7.5 | 8.78 | 96.2 | 7.4 | 5.23 | 96.1 | 7.3 | 4.55 | 96.1 |
| Comparative Example 4 | 66.2 | 31.8 | F | 0.5 | 7.3 | 7.32 | 96.1 | 7.3 | 5.55 | 96.0 | 7.2 | 4.76 | 96.0 |
| Comparative Example 5 | 66.2 | 31.8 | G | 0.5 | 8.0 | 5.91 | 98.5 | 8.0 | 4.70 | 98.5 | 7.9 | 3.95 | 98.5 |
| Comparative Example 6 | 66.2 | 31.8 | H | 0.5 | 7.0 | 8.51 | 94.1 | 7.2 | 8.01 | 95.1 | 7.2 | 7.11 | 95.2 |

Fig. 5

Table 3

| No. | Glass Ceramic Compositional Ratio (mass%) | | | | Baking: 920°C, 20 minutes | | | Baking: 920°C, 45 minutes | | | Baking: 920°C, 120 minutes | | |
|---|---|---|---|---|---|---|---|---|---|---|---|---|---|
| | Glass | Filler Alumina | Composite Oxide Composition | Composite Oxide Added Amount | Dielectric Constant (2GHz) | tanδ×10^-4 (2GHz) | Sintered Relative Density (%) | Dielectric Constant (2GHz) | tanδ×10^-4 (2GHz) | Sintered Relative Density (%) | Dielectric Constant (2GHz) | tanδ×10^-4 (2GHz) | Sintered Relative Density (%) |
| Exemplary Embodiment 9 | 66.2 | 31.8 | A | 0.5 | 7.6 | 2.95 | 98.7 | 7.6 | 2.8 | 98.8 | 7.6 | 2.75 | 98.8 |
| Comparative Example 7 | 66.2 | 31.8 | - | - | 7.7 | 5.76 | 98.3 | 7.7 | 4.87 | 98.4 | 7.6 | 3.55 | 98.5 |

GLASS CERAMIC SINTERED COMPACT AND WIRING BOARD

CROSS-REFERENCE TO RELATED APPLICATIONS

This application is a national stage application under 35 U.S.C. 371 of PCT/EP2016/060738, filed May 12, 2016, which claims the benefit of Japanese Patent Application Serial No. 2015-108744, filed on May 28, 2015, both of which are incorporated herein by reference in their entirety.

TECHNICAL FIELD

The present invention relates to a glass ceramic sintered compact and to a wiring board employing same. More specifically, the present invention relates to a glass ceramic sintered compact which is used in various types of module substrates and semiconductor element housing packages etc., and to a wiring board.

PRIOR ART

Alumina substrates employing alumina as the substrate material, and low-temperature-baked substrates employing a glass ceramic etc. have come to be used in recent years as the speed of data communication has increased and in view of the requirements of compactness and reliability in wiring boards on which various types of electronic components are mounted and large-scale integration (LSI).

Alumina substrates have advantages such as high-strength and excellent heat resistance, so a large proportion of wiring boards comprise alumina substrates. On the other hand, however, alumina substrates have a high dielectric constant and are therefore problematic in terms of handling higher frequencies in that they tend to delay transmission signals. In addition, alumina substrates are baked at a high temperature of 1500° C. or greater, so it is necessary to use a material having a high melting point such as W or Mo for the wiring of the inner layers, but these materials have high electrical resistance which also causes a problem in that the electrical resistance increases as the wiring becomes finer.

In contrast to this, wiring boards employing a glass ceramic material have a lower dielectric constant than alumina substrates and are also advantageous in that they allow a low-resistance metallic material having a low melting point, such as Ag or Ag—Pd, to be utilized for the wiring of the inner layers, and are therefore increasingly being used.

Glass ceramic materials are produced by mixing a glass material with a ceramic material such as alumina referred to as an aggregate, and baking the mixture. This kind of glass ceramic material produces a synergistic action when it is baked because of the combination of the glass material and the ceramic material, which makes it possible to control the characteristics of the resulting ceramic substrate (dielectric constant, loss characteristics, thermal expansion coefficient, baking temperature, transverse rupture strength etc.). This means that there is a technical problem in terms of finding the optimum combination and determining a stable structure and composition such that fixed characteristics are always produced.

Incidentally, there are more and more devices employing frequencies in a high-frequency band, such as mobile telephones and wireless LANs, and there is a growing requirement for conserving energy in such devices from an environmental standpoint. For this reason, the electronic components which are used in these devices need to have lower loss and there is a particular need for materials having low loss for electronic components that are used in the microwave and milliwave bands.

In terms of the abovementioned glass ceramic materials, attention is focusing on the use of crystallized glass as a glass material from the point of view of achieving characteristics of low dielectric constant and low dielectric loss. Among these, attention is focusing on a crystallized glass material having a main phase comprising a diopside crystal phase represented by $CaMgSi_2O_6$, with regard to low dielectric loss.

This kind of crystallized glass is a material in which specific crystals are deposited during baking and it is possible to reduce the dielectric loss of the glass ceramic material by increasing the crystallinity thereof. Increasing the crystallinity of the glass is therefore an important factor in achieving low dielectric loss in glass ceramic materials, but this involves an effective means for providing a large quantity of heat in order to increase the crystallinity of the glass.

It is desirable, however, to increase the crystallinity of the glass using the smallest possible amount of energy, i.e. the smallest possible quantity of heat, from the point of view of conserving energy during the process. Furthermore, when Ag is used as an internal conductor in the wiring board, it is desirable to be able to perform the treatment using the smallest possible quantity of heat from the point of view of restricting diffusion into the glass during the process (especially during baking).

Furthermore, higher frequencies are increasingly being employed for the frequency bands used nowadays, with cases of use in the milliwave band increasing, for example, in which case there is a greater effect from changes in the dielectric characteristics of materials causing variations in product characteristics. In light of this, it is also important to reduce variations in characteristics at the time of production.

In order to solve these problems, there have been proposals to achieve characteristics of reduced dielectric loss by using a crystallized glass material comprising, as the main phase, a diopside crystal phase in glass ceramic wiring boards, and by further combining this with various materials.

Patent Document 1 proposes a dielectric porcelain having reduced dielectric loss, comprising: 40-90 mass % diopside crystal-deposited crystallized glass; 6-60 mass % $Al_2O_3$; and 0.1-5 mass %, in terms of oxide equivalent, of at least one selected from among alkaline earth metal oxides, carbonates and hydroxides. There are problems apparent, however, with this technique of adding oxides such as those described in Patent Document 1 such as not only a lower effect in reducing dielectric loss, but also a reduction in sintered density as a result of the addition.

Furthermore, Patent Document 2 proposes a wiring-board glass ceramic composition having high crystallinity, characterized by containing 0.1-3 mol % of fluorine (F) as an anion component in a crystalline glass composition having properties such that diopside, cordierite or forsterite is deposited as a main crystal when baking is carried out. There are environmental problems during disposal and production with the technology described in Patent Document 2, however, because fluorine is used as an additive.

Furthermore, Patent Document 3 proposes a porcelain for high frequencies having a low dielectric loss in the high-frequency region, characterized by containing, in the following proportions: 40-99 wt % glass on which a diopside crystal phase can be deposited; and at least 1-60 wt % of γ-$Al_2O_3$ as a filler. This technique of adding γ-alumina described in Patent Document 3 is inadequate, however, in terms of the effect of reducing dielectric loss. It is therefore necessary to perform a heat treatment for a long time in a temperature region in excess of 900° C. in order to reduce the dielectric loss, and this requires a large quantity of heat.

PRIOR ART DOCUMENT

Patent Documents

[Patent Document 1] JP 4325920 B2
[Patent Document 2] JP 2010-52953 A
[Patent Document 3] JP 3793559 B2

SUMMARY OF THE INVENTION

Problem to be Solved by the Invention

The present invention has been devised in the light of this situation, and the aim thereof lies in providing a glass ceramic sintered compact in which dielectric loss in a high-frequency region is reduced, without any reduction in sintered density, and also in providing a wiring board employing same.

Means for Solving the Problems

As a result of diligent research compiled by the present inventors in order to achieve the abovementioned aim, it was found that said aim can be achieved by employing a specific composite oxide together with crystallized glass on which a predetermined diopside oxide crystal phase is deposited, and the present invention was completed on the basis of these findings.

That is to say, the essential points of the present invention are as follows.

[1] A glass ceramic sintered compact containing a glass component, a ceramic filler and a composite oxide, characterized in that the glass component is crystallized glass on which is deposited a diopside oxide crystal phase comprising at least Mg, Ca and Si; and
the composite oxide comprises at least Al and Co.

[2] A glass ceramic sintered compact according to [1] above, characterized in that the composite oxide further comprises Ti.

[3] A glass ceramic sintered compact according to [1] or [2] above, characterized in that the content of said composite oxide is 0.05-1.5 mass % in terms of oxide equivalent.

[4] A glass ceramic sintered compact according to any of [1] to [3] above, characterized in that the ceramic filler is $Al_2O_3$.

[5] A wiring board comprising an insulating base and a wiring conductor,
characterized in that the insulating base comprises the glass ceramic sintered compact according to any of [1] to [4] above.

The present invention makes it possible to obtain a glass ceramic sintered compact having a high sintered density and low dielectric loss in a high-frequency region, and also a wiring board employing same.

BRIEF DESCRIPTION OF THE FIGURES

FIG. 4 shows a comparative table illustrating dielectric loss of certain embodiments and comparative examples presented herein; and FIG. 5 shows a comparative table illustrating dielectric loss of certain embodiments and comparative examples presented herein.

MODE FOR IMPLEMENTING THE INVENTION

The glass ceramic sintered compact according to the present invention contains a glass component, a ceramic filler and a composite oxide, and is characterized in that the glass component is crystallized glass on which is deposited a diopside oxide crystal phase comprising at least Mg, Ca and Si; and the composite oxide comprises at least Al and Co.

This kind of glass ceramic sintered compact has a practicable and sufficient sintered density, low dielectric loss, and in particular the feature of low dielectric loss in a high-frequency region of 1 GHz or greater. In addition, such characteristics can still be achieved with a relatively small quantity of heat for baking, there is little fluctuation in characteristics with respect to the baking conditions (in particular baking time), and it is possible to limit variations in characteristics.

Modes for implementing the present invention will be described below with reference to the figures. It should be noted that in the figures, common members bear common reference symbols and such members will not be described again in full. Furthermore, the present invention is not limited in any way to the following modes of embodiment, and various modifications may be added to implement the present invention within the scope of the aim thereof. In addition, an appropriate description may be omitted for parts of the text which would constitute a duplication of the description, but this does not limit the essential point of the invention.

First Mode of Embodiment

A mode of the present invention will be described below, taking the example of a glass ceramic wiring board employing a glass ceramic sintered compact according to the present invention and a method for producing same.

Figure 1:
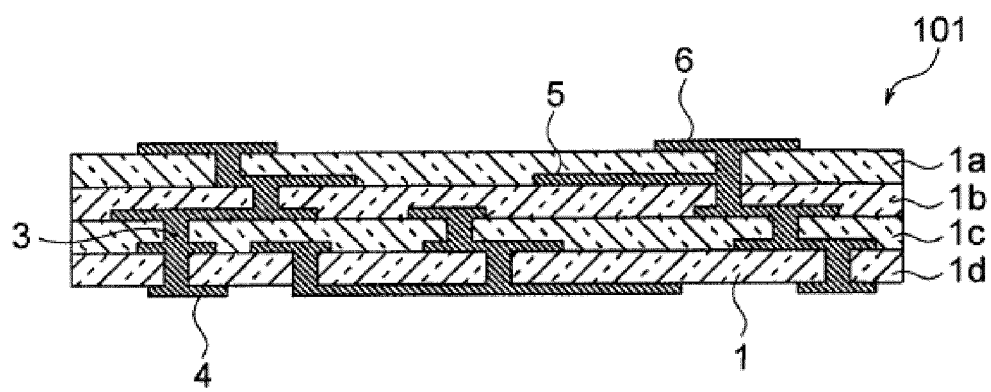
FIG. 1 is a schematic view in cross section of a glass ceramic wiring board according to the present invention.

FIG. 1 is a schematic view in cross section of a glass ceramic wiring board 101 according to this mode of embodiment. FIG. 1 depicts a view in cross section of the central region of one basic structure forming part of a circuit disposed at any pitch within a substrate.

As shown in FIG. 1, the glass ceramic wiring board 101 comprises insulating bases (insulating layers 1a-1d) formed by a glass ceramic sintered compact 1; and wiring conductors (a via conductor 3, a mounting surface-terminal 4, an internal conductor layer 5 and a surface conductor layer 6). That is to say, the glass ceramic wiring board 101 comprises the internal conductor layer 5 which is provided with a predetermined pattern between the insulating layers 1a-1d vertically adjacent in FIG. 1; the surface conductor layer 6 which is provided on the outer surface of the insulating layers 1a, 1d constituting outermost layers; and the mounting surface-terminal 4. In addition, the glass ceramic wiring board 101 comprises the via conductor 3 which passes through the insulating layers 1a-1d and connects the internal conductor layers 5 present at different positions in the layers or connects the surface conductor layer 6 and the internal conductor layer 5.

It should be noted that in the glass ceramic wiring board 101 according to the mode of embodiment shown in FIG. 1, the via conductor 3 connects the internal conductor layers 5 present at different positions in the layers or connects the surface conductor layer 6 and the internal conductor layer 5, but the present invention is not limited to this arrangement.

Furthermore, the insulating layers 1a-1d may be obtained by baking a single green sheet, or they may be obtained by baking a stack comprising a plurality of green sheets. Furthermore, the number of layers in the stack of insulating layers 1a-1d is not limited to the number in the mode of embodiment depicted.

Furthermore, there is no particular limitation as to the external shape or dimensions of the glass ceramic wiring board 101, which may be appropriately set according to the application; the external shape is normally essentially cuboid and the dimensions are normally of the order of length (50-200) mm×breadth (50-200) mm×thickness (0.2-1.5) mm.

The insulating layers 1a-1d are formed by the glass ceramic sintered compact 1 according to a mode of embodiment of the present invention.

That is to say, the ceramic sintered compact according to this mode of embodiment is a glass ceramic sintered compact containing a glass component, a ceramic filler and a composite oxide, the glass component is crystallized glass on which is deposited a diopside oxide crystal phase comprising at least Mg, Ca and Si, and the composite oxide comprises at least Al and Co.

This kind of glass ceramic sintered compact has a practicable and sufficient sintered density, low dielectric loss, and in particular the feature of low dielectric loss in a high-frequency region of 1 GHz or greater. In addition, such characteristics can be achieved under baking conditions involving a small quantity of heat, there is little fluctuation in characteristics with respect to the baking conditions (in particular baking time), and it is possible to limit variations in characteristics.

This kind of glass ceramic sintered compact has low dielectric loss in a high-frequency region and can be baked at a low temperature of 1000° C. or less. A glass ceramic sintered compact such as this therefore makes it possible to form conductor layers using low-resistance metals such as Ag, and it is possible to obtain a glass ceramic wiring board suitable for a package on which various types of modules or semiconductor elements etc. are mounted, in which microwaves or milliwaves are employed.

Moreover, this kind of glass ceramic sintered compact makes it possible to reduce variations in characteristics during the production process, while also making it possible to maintain an adequate sintered density, so there are also no problems in terms of reliability such as a reduction in strength.

In addition, this kind of glass ceramic sintered compact can be baked in a highly crystalline state even with a relatively small quantity of heat, and therefore it is also possible to lessen diffusion into the glass of the low-resistance metal such as Ag, so it is possible to realize a wiring board that has few fluctuations in terms of characteristics.

The glass ceramic sintered compact according to this mode of embodiment will be described in detail below.

(Glass Component)

The glass component contained in the glass ceramic sintered compact according to this mode of embodiment is crystallized glass on which is deposited a diopside oxide crystal phase comprising at least Mg, Ca and Si. A glass component such as this having a diopside crystal phase as the main phase reduces dielectric loss of the ceramic sintered compact in the high-frequency region.

Here, the "crystallized glass on which is deposited a diopside oxide crystal phase" (also referred to below as the "diopside crystallized glass") is a glass on which a diopside crystal is deposited as the main crystal by means of baking.

The diopside crystallized glass according to this mode of embodiment comprises at least Mg, Ca and Si, and preferably further comprises at least one selected from the group consisting of Al, Cu, Sr, Zn and Ti. It should be noted that the diopside crystallized glass according to this mode of embodiment may comprise components other than those mentioned above within a range that does not detract from the characteristics such as dielectric loss.

Mg is a constituent component of the diopside crystal in the diopside crystallized glass according to this mode of embodiment. The content of Mg is preferably 11-30 mass %, and more preferably 12-25 mass %, in terms of MgO equivalent, with respect to the total quantity of diopside crystallized glass. If the Mg content is excessively low, crystals do not tend be readily deposited, while if it is excessively high, there tends to be a difficulty in glass formation during production.

Ca is a constituent component of the diopside crystal in the diopside crystallized glass according to this mode of embodiment. The content of Ca is preferably 20-35 mass %, and more preferably 25-30 mass %, in terms of CaO equivalent, with respect to the total quantity of diopside crystallized glass. If the Ca content is excessively low, there tends to be an increase in dielectric loss, while if it is excessively high, there tends to be a difficulty in glass formation during production.

Si is a network former in the diopside crystallized glass according to this mode of embodiment while also being a constituent component of the diopside crystal. The content of Si is preferably 40-65 mass %, and more preferably 45-65 mass %, in terms of $SiO_2$ equivalent, with respect to the total quantity of diopside crystallized glass. If the Si content is excessively low, there tends to be a difficulty in glass formation, while if it is excessively high, there tends to be a reduction in density.

Al is a component for regulating crystallinity of the glass in the diopside crystallized glass according to this mode of embodiment. The content of Al is preferably 0.5-10 mass %, and more preferably 1-5 mass %, in terms of $Al_2O_3$ equivalent, with respect to the total quantity of diopside crystallized glass. If the Al content is excessively low, the crystallinity becomes excessively strong and there tends to be a difficulty in glass moulding, while if it is excessively high, diopside crystals do not tend to be readily deposited.

Cu is a component in the diopside crystallized glass which donates electrons to the Ag and limits diffusion into the glass ceramic. The content of Cu is preferably 0.01-1.0 mass %, in terms of CuO equivalent, with respect to the total quantity of diopside crystallized glass component. If the Cu content is excessively low, the abovementioned effect tends not to be adequately demonstrated, while if it is excessively high, there tends to be an excessive increase in dielectric loss.

Sr, Zn and Ti are components for facilitating glass formation in the diopside crystallized glass component. The content of each component is preferably 0-10 mass %, and more preferably 0-5 mass %, in terms of respective equivalents of SrO, ZnO and $TiO_2$, with respect to the total quantity of the diopside crystallized glass component. If the content of these components is excessively high, there is a weakening of crystallinity and a reduction in the amount of diopside deposition so there tends to be an increase in dielectric loss.

Furthermore, according to this mode of embodiment, the content of the glass component is preferably 55-85 mass %, and more preferably 65-80 mass % with respect to the glass ceramic sintered compact as a whole. The mechanical strength can be improved by setting the content of the glass component in the abovementioned range.

(Ceramic Filler)

There is no particular limitation as to the ceramic filler contained in the glass ceramic sintered compact according to this mode of embodiment, but mention may be made of ceramic fillers or the like formed by means of at least one material selected from the group consisting of: alumina, magnesia, spinel, silica, mullite, forsterite, steatite, cordierite, strontium feldspar, quartz, zinc silicate, zirconia and titania. It should be noted that the ceramic filler according to this mode of embodiment may comprise components other than those mentioned above within a range that does not detract from the characteristics such as dielectric loss.

According to this mode of embodiment, the ceramic filler contributes to improving mechanical strength and regulating dielectric characteristics.

There is no particular limitation as to the shape of the ceramic filler, and a plate shape or spherical shape, or an indefinite shape etc. may be used. Furthermore, there is no particular limitation as to the mean particle size of the ceramic filler, but it is preferably 2-10 μm, and more preferably 2-5 μm.

In addition, according to this mode of embodiment, the ceramic filler is preferably an alumina filler ($Al_2O_3$), and it is more preferably formed by a plate-shaped alumina filler.

Furthermore, according to this mode of embodiment, the content of the ceramic filler is preferably 20-40 mass %, and more preferably 25-35 mass %, with respect to the glass ceramic sintered compact as a whole. It is possible to realize a sintered compact having outstanding sintering properties without any defects such as voids.

(Composite Oxide)

The composite oxide contained in the glass ceramic sintered compact according to this mode of embodiment comprises at least Al and Co. This kind of composite oxide promotes crystallization of the glass component having a diopside crystal phase as the main phase, and contributes to reducing dielectric loss in the glass ceramic sintered compact.

The composite oxide according to this mode of embodiment preferably further comprises Ti. It should be noted that the composite oxide according to this mode of embodiment may comprise components other than those mentioned above within a range that does not detract from the characteristics such as dielectric loss. Examples of components other than those mentioned above which may be cited include Mn and Cu, for example. Furthermore, the composite oxide preferably does not substantially include Fe, except where inevitably contained.

The content of Al in the composite oxide according to this mode of embodiment is preferably 3-70 mass %, and more preferably 5-50 mass %, in terms of $Al_2O_3$ equivalent, with respect to the total quantity of composite oxide.

The content of Co in the composite oxide according to this mode of embodiment is preferably 10-50 mass %, and more preferably 14-45 mass %, in terms of CoO equivalent, with respect to the total quantity of composite oxide.

The content of Ti in the composite oxide according to this mode of embodiment is preferably 0-80 mass %, and more preferably 5-25 mass %, in terms of $TiO_2$ equivalent, with respect to the total quantity of composite oxide.

In addition, the total content of Al, Co and Ti in the composite oxide according to this mode of embodiment is preferably at least 90 mass %, and more preferably 95-100 mass %, in terms of the total of the abovementioned oxide equivalents, with respect to the total quantity of the composite oxide. The effect of reducing dielectric loss is enhanced by setting the total content in the abovementioned range.

Furthermore, according to this mode of embodiment, the content of composite oxide comprising at least Al and Co is preferably greater than 0 but no greater than 2 mass %, more preferably 0.05-1.5 mass %, and even more preferably 0.2-0.8 mass %, with respect to the glass ceramic sintered compact as a whole. Setting the content of the abovementioned predetermined composite oxide in the abovementioned range promotes efficient crystallization with respect to the glass component while also improving sintering properties.

A description has been given above of the predetermined glass component, ceramic filler and predetermined composite oxide as the components forming the glass ceramic sintered compact according to this mode of embodiment, but the glass ceramic sintered compact according to this mode of embodiment may contain components other than those mentioned above within a range that does not impair the effect of the present invention. Moreover, in this case, the content of the components other than those mentioned above is preferably no greater than 10 mass %, and more preferably no greater than 5 mass %, of the glass ceramic sintered compact as a whole. Amorphous glass components and oxides other than those mentioned above etc. may be mentioned as components other than those mentioned above.

It should be noted that a method which is conventionally known from the prior art may be used as the method for measuring the various components contained in the glass ceramic sintered compact according to this mode of embodiment; such methods of measurement include a process of analysis by means of an X-ray fluorescence (XRF) analyser, or processes involving fusing a sample and performing analysis by means of an inductively coupled plasma optical emission spectrometer (ICP-AES) or an inductively coupled plasma mass spectrometer (ICP-MS).

A preferred mode of embodiment has been described above for the glass ceramic wiring board 101 according to a mode of embodiment of the present invention, but the present invention is not limited to the abovementioned mode of embodiment.

Furthermore, nor is there any particular limitation as to the number of insulating bases (insulating layers) provided in the wiring board, or the structure or material of the wiring conductors (internal conductor layers, surface conductor layers and via conductors etc.). Ag, Au, Cu, Pt, Ni and the like may be mentioned as examples of materials for the wiring conductors.

(Production Method)

Figure 2:
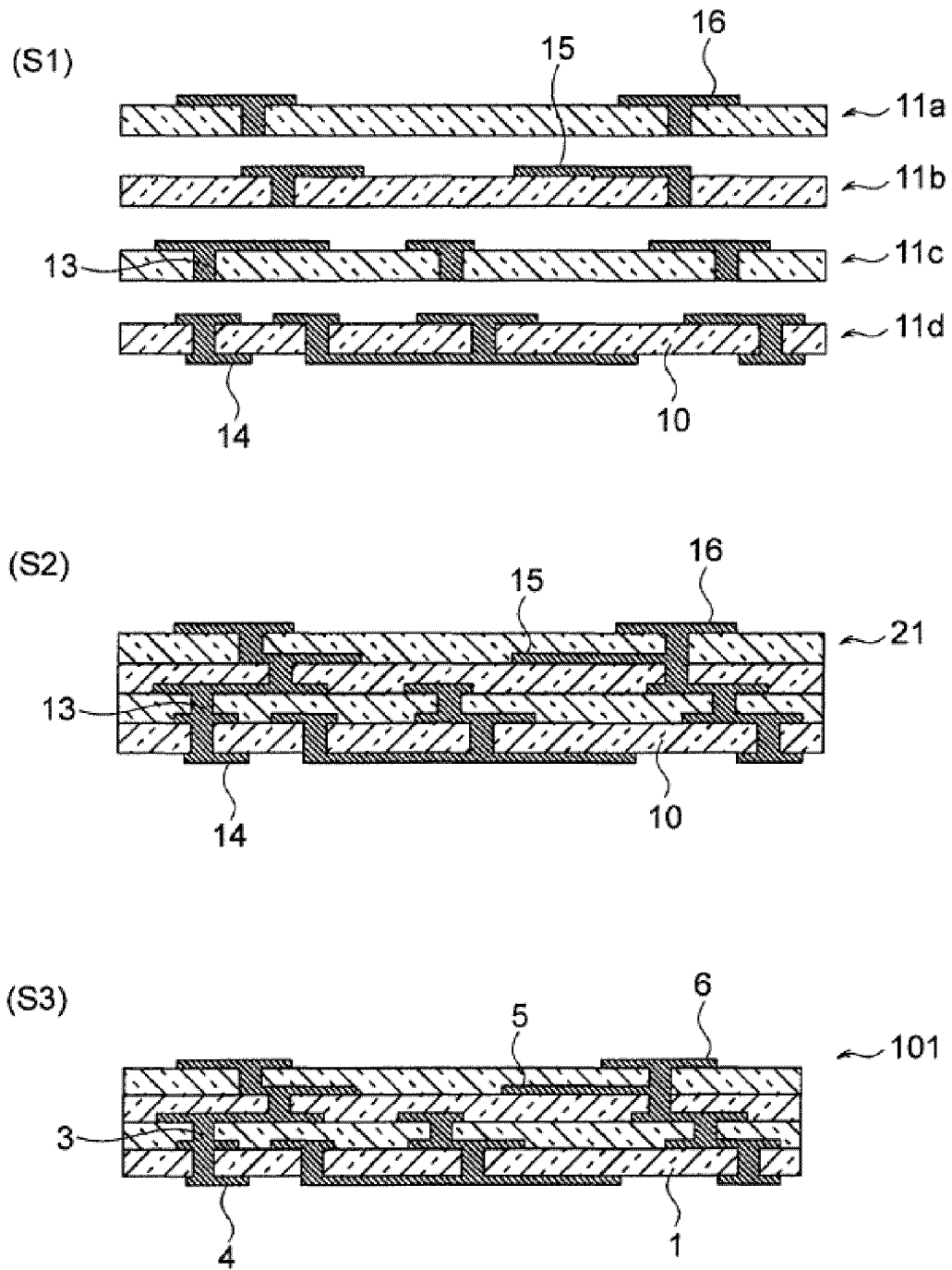
FIG. 2 (S1)-FIG. 2 (S3) are schematic views in cross section showing an example of the flow in a method for producing a glass ceramic wiring board according to a mode of embodiment of the present invention.

A preferred mode of embodiment of a method for producing the glass ceramic wiring board according to this mode of embodiment will be described next with reference to the figures. FIG. 2 (S1)-FIG. 2 (S3) are schematic views in cross section to illustrate the flow in a method for producing the glass ceramic wiring board. In particular, FIG. 2 (S1) is a schematic view in cross section of green sheets for a glass ceramic wiring board on which various patterns are formed before the board is baked. Furthermore, FIG. 2 (S2) is a schematic view in cross section of a stack for a glass ceramic wiring board before baking, in which the green sheets for a glass ceramic wiring board prepared in FIG. 2 (S1) are stacked. In addition, FIG. 2 (S3) is a schematic view in cross section of a glass ceramic wiring board obtained by baking the stack shown in FIG. 2 (S2).

The glass ceramic wiring board according to this mode of embodiment is produced in the same way as a conventional glass ceramic wiring board, namely by firstly preparing green sheets 11a-11d for a glass ceramic wiring board, in which are formed at least one via conductor pattern 3, internal conductor pattern 5 and surface conductor pattern 6, as shown in FIG. 2 (S1).

Specifically, green sheets 10 are prepared, and the various conductor patterns 3, 4, 5 and 6 are formed by means of the following method.

[Preparation of Green Sheets]

At least a glass component, a ceramic filler and a composite oxide are first of all prepared as starting materials for the components forming the glass ceramic sintered compact.

Crystallized glass on which is deposited a diopside oxide crystal phase comprising at least Mg, Ca and Si is used as the glass component. This kind of diopside crystallized glass may further comprise components such as Al, Cu, Sr, Zn and Ti, and may also comprise components other than those mentioned above within a range that does not detract from the characteristics such as dielectric loss.

The diopside crystallized glass according to this mode of embodiment comprises at least Mg, Ca and Si, and preferably further comprises at least one selected from the group consisting of Al, Cu, Sr, Zn and Ti. It should be noted that the diopside crystallized glass according to this mode of embodiment may also comprise components other than those mentioned above within a range that does not detract from the characteristics such as dielectric loss.

Mg is a constituent component of the diopside crystal in the diopside crystallized glass according to this mode of embodiment. The content of Mg is preferably 11-30 mass %, and more preferably 12-25 mass %, in terms of MgO equivalent, with respect to the total quantity of diopside crystallized glass. If the Mg content is excessively low, crystals do not tend be readily deposited, while if it is excessively high, there tends to be a difficulty in glass formation during production.

Ca is a constituent component of the diopside crystal in the diopside crystallized glass according to this mode of embodiment. The content of Ca is preferably 20-35 mass %, and more preferably 25-30 mass %, in terms of CaO equivalent, with respect to the total quantity of diopside crystallized glass. If the Ca content is excessively low, there tends to be an increase in dielectric loss, while if it is excessively high, there tends to be a difficulty in glass formation during production.

Si is a network former in the diopside crystallized glass according to this mode of embodiment while also being a constituent component of the diopside crystal. The content of Si is preferably 40-65 mass %, and more preferably 45-65 mass %, in terms of $SiO_2$ equivalent, with respect to the total quantity of diopside crystallized glass. If the Si content is excessively low, there tends to be a difficulty in glass formation, while if it is excessively high, there tends to be a reduction in density.

Al is a component for regulating crystallinity of the glass in the diopside crystallized glass according to this mode of embodiment. The content of Al is preferably 0.5-10 mass %, and more preferably 1-5 mass %, in terms of $Al_2O_3$ equivalent, with respect to the total quantity of diopside crystallized glass. If the Al content is excessively low, the crystallinity becomes excessively strong and there tends to be a difficulty in glass moulding, while if it is excessively high, diopside crystals do not tend to be readily deposited.

Cu is a component in the diopside crystallized glass which donates electrons to the Ag and limits diffusion into the glass ceramic. The content of Cu is preferably 0.01-1.0 mass %, in terms of CuO equivalent, with respect to the total quantity of diopside crystallized glass component. If the Cu content is excessively low, the abovementioned effect tends not to be adequately demonstrated, while if it is excessively high, there tends to be an excessive increase in dielectric loss.

Sr, Zn and Ti are components for facilitating glass formation in the diopside crystallized glass component. The content of each component is preferably 0-10 mass %, and more preferably 0-5 mass %, in terms of respective equivalents of SrO, ZnO and $TiO_2$, with respect to the total quantity of the diopside crystallized glass component. If the content of these components is excessively high, there is a weakening of crystallinity and a reduction in the amount of diopside deposition, so there tends to be an increase in dielectric loss.

It should be noted that one type of crystallized glass from those mentioned above may be used alone as the glass component, or multiple types may be combined for use, or the abovementioned crystallized glass may be used in conjunction with another glass (also including crystallized glass) provided that it is within a range that does not impair the effect of the present invention.

There is no particular limitation as to the ceramic filler and it is possible to use a known material. For example, mention may be made of ceramic fillers or the like formed by means of at least one material selected from the group consisting of: alumina, magnesia, spinel, silica, mullite, forsterite, steatite, cordierite, strontium feldspar, quartz, zinc silicate, zirconia and titania. It should be noted that the ceramic filler according to this mode of embodiment may comprise components other than those mentioned above within a range that does not detract from the characteristics such as dielectric loss.

Furthermore, there is no particular limitation as to the shape of the ceramic filler, and a plate shape or spherical shape, or an indefinite shape etc. may be used. Furthermore, there is no particular limitation as to the mean particle size of the ceramic filler, but it is preferably 2-10 μm, and more preferably 2-5 μm.

In addition, according to this mode of embodiment, an alumina filler ($Al_2O_3$) is preferably used as the ceramic filler, and a plate-shaped alumina filler is more preferably used.

It should be noted that the ceramic filler may comprise components other than those mentioned above within a range that does not detract from the characteristics such as dielectric loss, and it may be used alone or in combination. In either case, commercially available materials or produced materials may be used.

A composite oxide comprising at least Al and Co is used as the composite oxide.

This kind of composite oxide may further comprise components such as Ti or Mn and Cu, and it may comprise components other than those mentioned above within a range that does not detract from the characteristics such as dielectric loss.

Furthermore, even if an oxide corresponding to the constituent components of a predetermined composite oxide such as $Al_2O_3$ or CoO is used alone, the same effects are not observed as in the case of a glass ceramic sintered compact obtained using a composite oxide comprising Al and Co.

The content of Al in the composite oxide according to this mode of embodiment is preferably 3-70 mass %, and more preferably 5-50 mass %, in terms of $Al_2O_3$ equivalent, with respect to the total quantity of composite oxide.

The content of Co in the composite oxide according to this mode of embodiment is preferably 10-50 mass %, and more preferably 14-45 mass %, in terms of CoO equivalent, with respect to the total quantity of composite oxide.

The content of Ti in the composite oxide according to this mode of embodiment is preferably 0-80 mass %, and more preferably 5-25 mass %, in terms of $TiO_2$ equivalent, with respect to the total quantity of composite oxide.

In addition, the total content of Al, Co and Ti in the composite oxide according to this mode of embodiment is preferably at least 90 mass %, and more preferably 95-100 mass %, in terms of the total of the abovementioned oxide equivalents, with respect to the total quantity of the composite oxide.

It should be noted that one type of composite oxide from those mentioned above may be used alone, or multiple types may be combined for use, or the abovementioned composite oxide may be used in conjunction with another composite oxide provided that it is within a range that does not impair the effect of the present invention. In any case, commercially available materials or produced materials may be used.

Furthermore, according to this mode of embodiment, the composite oxide refers to the use as a composite oxide comprising Al and Co. The glass ceramic sintered compact according to the present invention can therefore not be obtained in the form of a single oxide such as $Al_2O_3$ or CoO or $TiO_2$ corresponding to the constituent components of said composite oxide, even if the other starting materials mentioned above (the predetermined crystallized glass etc.) are added together therewith, so the action and effect of the present invention cannot be achieved either.

That is to say, a composite oxide comprising Al and Co is not formed in the glass ceramic sintered compact obtained even if an oxide such as $Al_2O_3$ or CoO is used in combination instead of a composite oxide comprising Al and Co. The reason for this is that, although an oxide such as $Al_2O_3$ or CoO corresponds to the constituent components of the abovementioned predetermined composite oxide, even if these are used alone, a chemical reaction to the extent that these oxides change to a composite oxide does not take place at the baking temperature of the glass ceramic sintered compact which will be described later.

A composite oxide which is combined in such a way that a predetermined composition is formed is therefore preferably used in the production method according to this mode of embodiment.

For example, the abovementioned predetermined composite oxide may be prepared (produced) in accordance with the following production process. That is to say, the production process comprises a mixing step, a calcining step, a grinding step, and a drying step. These will be described in specific terms below.

A predetermined amount of the main-component raw material powder is weighed out and mixed (mixing step). In addition to an oxide powder comprising the constituent elements (e.g., Al, Co and Ti etc.), it is possible to use powders of compounds that form an oxide as a result of heating, e.g. carbonates, hydroxides, oxalates and nitrates etc.). In this case, the mixture is not limited to one type of metal oxide (compound), and it is equally possible to use an oxide compound powder comprising two or more types of metals, for example, as the raw material powder. The mean particle size of the raw material powders should be selected, as appropriate, in the range of 0.1 µm-5.0 µm.

In terms of the mixing method, it is possible to use wet mixing or the like employing a ball mill, for example, and after the mixing, the mixture is dried, ground and sieved, and then the calcining step is performed. In the calcining step, the mixture is maintained for a predetermined time at a temperature in the range of 800° C.-1300° C. using an electric furnace or the like. There are no particular stipulations as to the atmosphere in this case, and any atmosphere is acceptable, but an oxidizing atmosphere is preferred. Furthermore, the holding time for calcination should be selected, as appropriate, in the range of 0.5-5.0 hours.

After the calcination, the calcined material is ground to a mean particle size of around 0.5 µm-2.0 µm, for example, in the grinding step. A ball mill or the like may be used as the grinding means.

After the grinding, the finely-ground powder is dried in the drying step. Spray drying or the like may be used as the drying method. The composite oxide prepared in this way may then be used as a starting material.

The abovementioned starting materials are then weighed out in accordance with the compositional ratio of the glass ceramic sintered compact to be produced, and mixed to form a starting material powder.

According to this mode of embodiment, the amount of glass component added is preferably 55-85 mass %, and more preferably 65-75 mass %, within 100 mass % of the starting material powder.

Furthermore, the content of ceramic filler component is preferably 20-40 mass %, and more preferably 25-35 mass %, within 100 mass % of the starting material powder.

In addition, the content of the abovementioned predetermined composite oxide is preferably greater than 0 mass % but no greater than 2 mass %, more preferably 0.05-1.5 mass %, and even more preferably 0.2-0.8 mass %, within 100 mass % of the starting material powder. If the composite oxide content is excessively high, partial crystallization starts before the glass as a whole has achieved a sufficiently fluid state, and this may cause problems such as a deterioration in sintering properties, specifically leading to an increase in internal voids, and not only a deterioration in characteristics but also less reliability due to the effect of the voids.

According to this mode of embodiment, there is no particular limitation as to the method of mixing, but it may be carried out by means of wet mixing employing a ball mill or the like with the addition of water or an organic solvent, and a binder or plasticizer or a dispersant etc., as required. The abovementioned starting material mixture (starting material powder) is thus formed into a paint, and a paste for a green sheet is prepared.

The paste for a green sheet may be an organic paint in which the abovementioned starting material powder and an organic vehicle are kneaded, or it may be an aqueous paint. There is no particular limitation as to the amount of solvent or additives added thereto, and normal amounts thereof should be added, selected appropriately in accordance with the mixing apparatus used and the film thickness etc. of the sheet formed in the subsequent steps.

For example, when an organic vehicle is used, the content of the organic vehicle in the paste for a green sheet should be such that the binder is at around 5-15 wt % and the solvent is at around 50-150 wt %, with respect to 100 wt % of the starting material powder. Furthermore, the various types of additives such as dispersants and plasticizers which are added, as required, preferably constitute no more than 10 wt % of this total content.

Moreover, examples of binders which may be mentioned include polyvinyl butyral resin and methacrylic acid resin. An example of a plasticizer which may be mentioned includes dibutyl phthalate. Examples of solvents which may be mentioned include toluene and methyl ethyl ketone.

The resulting paste for a green sheet is formed as a film on a support such as a polyethylene terephthalate (PET) sheet, and a green sheet 10 is formed on the support.

Film-forming methods which may be used include moulding methods such as a doctor blade process or a calender roll process.

[Formation of Conductor Pattern]

The green sheet 10 produced by means of the abovementioned method is prepared, and various types of conductor patterns (internal conductor pattern 15, surface conductor pattern 16, mounting surface-terminal pattern 14, and via conductor pattern 13 etc.) are formed, whereby green sheets 11a-11d for a glass ceramic wiring board are prepared.

Specifically, as shown in FIG. 2 (S1), through-holes (via holes) are first of all formed at predetermined positions in the green sheet 10 which has been prepared, and these holes are filled with a conductor paste in order to form the via conductor pattern 13. Furthermore, a conductor paste is printed in a predetermined pattern on the surface of the green sheet 10 forming the inner layer, in order to form the internal conductor pattern 15. In addition, the surface conductor pattern 16 and the mounting surface-terminal pattern 14 are formed in the green sheet 10 disposed on the outermost side. It should be noted that electronic elements (inductors and capacitors etc.) may be formed in the green sheet 10, as required.

The conductive paste which is used to form the conductor pattern may be prepared by kneading an organic vehicle and a conductive material comprising various types of conductive metals or alloys, such as Ag, Ag—Pd alloy, Cu and Ni. The organic vehicle which is used in the conductive paste contains a binder and a solvent as the main components. There is no particular limitation as to the mixing ratio of the binder, solvent and conductive material, and 1-15 mass % of the binder and 10-50 mass % of the solvent may be mixed with the conductive material, for example. Additives selected from various types of dispersants and plasticizers etc. may be added to the conductive paste, as required.

Next, as shown in FIG. 2 (S2), the green sheets 11a, 11b, 11c and 11d for a glass ceramic wiring board are stacked in succession to form a stack 21 for a glass ceramic wiring board.

After this, the stack 21 for a glass ceramic wiring board is pressed, after which components such as the organic vehicle in the stack 21 for a glass ceramic wiring board are removed under a heated air atmosphere and baking is carried out under an air atmosphere at 800-1000° C. in order to obtain a glass ceramic wiring board 101 such as that shown in FIG. 2 (S3).

In this process, a diopside crystal phase represented by $CaMgSi_2O_6$ is deposited in the green sheets as a result of the baking, and a dense, low-loss glass ceramic sintered compact is produced.

According to this mode of embodiment in particular, the predetermined composite oxide added together with the glass component is believed to produce an action of promoting glass crystallization, and as a result it is possible to obtain a glass ceramic sintered compact for high frequencies, especially for microwaves, by achieving a reduction in dielectric loss.

Furthermore, the via conductor pattern 13 inside the via holes forms the via conductor 3, the mounting surface-terminal pattern 14 forms the mounting surface-terminal 4, the internal conductor pattern 15 forms the internal conductor layer 5, and the surface conductor pattern 16 forms the surface conductor layer 6.

In some cases, gold may further be applied over the surface conductor pattern by means of plating. In this case, a metal such as nickel or palladium may be applied as a base for the gold plating.

Second Mode of Embodiment

A different mode of embodiment from that given above will be described next, taking the example of a glass ceramic substrate employing the glass ceramic sintered compact according to the present invention, and a method for producing same. It should be noted that the present mode of embodiment has the same configuration and action/effect as the first mode of embodiment, other than the parts indicated below, and a duplicate description will be partially omitted.

Figure 3:
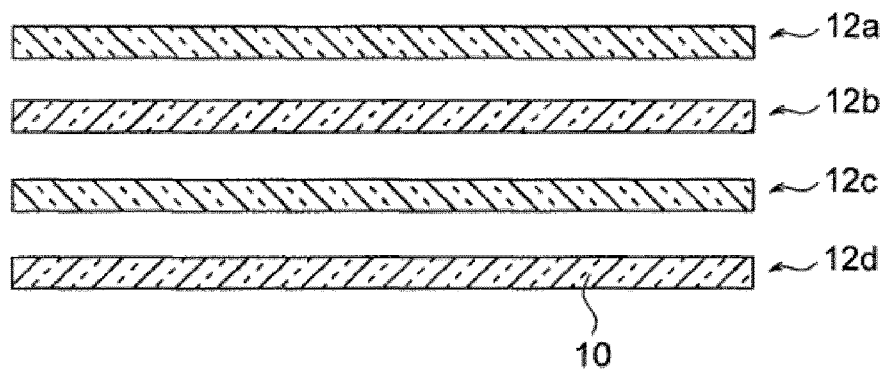
FIG. 3 (S1)-FIG. 3 (S3) are schematic views in cross section showing an example of the flow in a method for producing a glass ceramic wiring board according to another mode of embodiment of the present invention.
Figure 3:
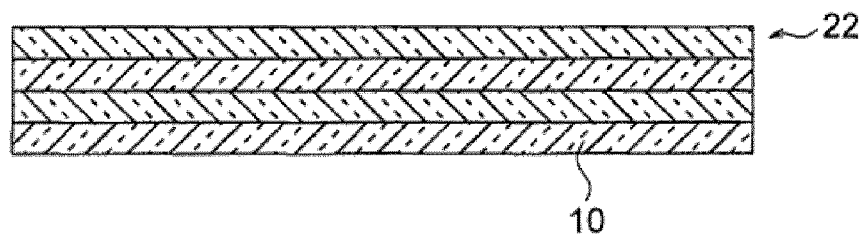
Figure 3:
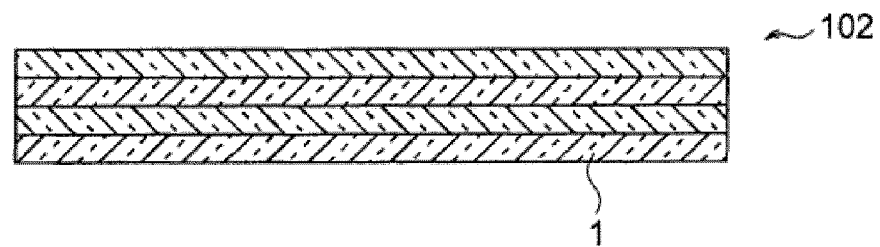

FIG. 3 is a view in cross section to illustrate a method for producing a glass ceramic substrate according to the second mode of embodiment. In particular, FIG. 3 (S1) is a schematic view in cross section of green sheets for a glass ceramic substrate before baking. Furthermore, FIG. 3 (S2) is a schematic view in cross section of a stack for a glass ceramic substrate before baking, in which the green sheets for a glass ceramic substrate prepared in FIG. 3 (S1) are stacked. In addition, FIG. 3 (S3) is a schematic view in cross section of a glass ceramic substrate obtained by baking the stack shown in FIG. 3 (S2).

According to this mode of embodiment, the green sheets 10 are first of all prepared, as shown in FIG. 3 (S1). Specifically, the green sheets should be prepared in the same way as described above. Next, as shown in FIG. 3 (S2), green sheets 12a, 12b, 12c and 12d for a glass ceramic substrate are stacked in succession to obtain a stack 22 for a glass ceramic substrate. After this, the stack 22 for a glass ceramic substrate is pressed, components such as the organic vehicle in the stack 22 for a glass ceramic substrate are removed under a heated air atmosphere, and baking is carried out to obtain a glass ceramic substrate 102 such as that shown in FIG. 3 (S3).

The glass ceramic substrate 102 according to this mode of embodiment comprises the glass ceramic sintered compact 1 according to the present invention.

Modes of embodiment of the present invention have been described above, but the present invention is not limited in any way to these modes of embodiment, and the present invention may of course be implemented in various modes within a scope that does not depart from the essential point of the present invention.

For example, in the second mode of embodiment, the green sheets are stacked and a glass ceramic stack is formed to prepare the glass ceramic substrate, but the green sheets do not necessarily have to be stacked, and a single green sheet formed to a predetermined thickness may equally be baked to form the glass ceramic substrate.

Exemplary Embodiments

The present invention will be described in further detail below with reference to exemplary embodiments and comparative examples, but the present invention is not limited to the following exemplary embodiments.

Preparation of Composite Oxide

Production Example 1

$Al_2O_3$, $Co_3O_4$, $TiO_2$, MnO, $Fe_2O_3$ and CuO were prepared, the respective starting materials were weighed out in such a way that the compositional ratio after calcination and fine-grinding reached the values shown in table 1, and the material was wet-mixed for 16 hours using a ball mill. The resulting slurry was thoroughly dried, after which it was calcined while being maintained under the atmosphere for 2 hours at 1100° C., and a calcined material was obtained. After this, the calcined material was finely ground by means of a ball mill until the mean particle size was 1.0 μm, after which the finely-ground powder was dried to obtain composite oxide powders having the compositions A-H.

TABLE 1

| Composite oxide composition | Compositional ratio (mass %) | | | | | |
|---|---|---|---|---|---|---|
| | $Al_2O_3$ | CoO | $TiO_2$ | MnO | $Fe_2O_3$ | CuO |
| A | 5.5 | 14.5 | 80.0 | — | — | — |
| B | 63.0 | 36.5 | — | — | — | 0.5 |
| C | 30.0 | 45.5 | 20.0 | 4.5 | — | — |
| D | 58.0 | 42.0 | — | — | — | — |
| E | — | 100.0 | — | — | — | — |
| F | — | — | — | 100.0 | — | — |
| G | — | — | 100.0 | — | — | — |
| H | 10.0 | — | — | 43.0 | 15.0 | 32.0 |

Exemplary Embodiments 1-8 and Comparative Examples 1-6

[Preparation of Glass Ceramic Sintered Compact]

A glass powder (crystallized glass powder on which was deposited a diopside comprising $SiO_2$=50 mass %, CaO=16 mass %, MgO=20 mass %, $Al_2O_3$=5 mass %), an alumina filler (mean particle size 1.5 μm), and composite oxide powders obtained in Production Example 1 were prepared, and each of the materials was weighed out in such a way that the compositional ratio of each sample reached the values shown in table 2.

19.4 g of acrylic resin, 59.1 g of toluene, 3 g of ethanol, and 6.5 g of a plasticizer (butyl phthalyl butyl glycolate) were then mixed in order to prepare an organic vehicle.

The glass powder, alumina filler and predetermined composite oxide powders which had been weighed out, and the organic vehicle prepared were then combined and mixed for 24 hours using a ball mill in order to prepare paints for forming green sheets for a substrate.

The paints for a green sheet for a substrate were formed as films by means of a doctor blade process on a polyethylene terephthalate film in order to form green sheets for a substrate. It should be noted that the thickness of the green sheets was adjusted in such a way as to reach 50 μm after baking. 10 sheets were then stacked, after which they were pressed at 74 MPa, then baked under the atmosphere at 900° C. under three conditions of 30 minutes, 60 minutes and 120 minutes, and glass ceramic sintered compacts were produced.

[Evaluation of Glass Ceramic Sintered Compact]

The glass ceramic sintered compacts obtained were evaluated with regard to composition, dielectric constant, dielectric loss and relative density. The results are shown in table 2. It should be noted that the various items evaluated were evaluated by means of the following methods.

[Compositional Evaluation]

The compositions of the glass ceramic sintered compacts obtained were analysed. The compositional analysis was carried out by a method of analysis employing an X-ray fluorescence (XRF) analyser. As a result, it was confirmed that the composition of each sintered compact was equivalent to the feed composition (the compositions in tables 1 and 2 in particular).

[Dielectric Constant and Dielectric Loss]

For the dielectric constant ε and the dielectric loss tan δ, the characteristics at 2 GHz were evaluated by means of cavity resonator perturbation (in accordance with JISC2565). The glass ceramic sintered compacts were moulded to a predetermined shape and evaluated. Specifically, the measurement was carried out by cutting glass ceramic sintered compacts from the sintered substrate into a rod shape of 0.5×0.5×80 mm, and the rod-shaped samples which had been cut out were inserted into a cavity resonator which resonated at a specific frequency (e.g., 2 GHz). Furthermore, the cavity resonator was connected to a vector network analyser N5222a produced by Agilent Technologies for measuring the state of the resonance peak in the cavity resonator, and to a computer for performing the analysis; the measurements were taken using this series of systems.

[Relative Density]

For the relative density of the sintered compacts, the specific gravity was measured (Sg) by means of the Archimedes method, after which the relative density was calculated by means of the following calculation formula.

Relative density (%)=Sg/[(specific gravity×content (%) of glass)+(specific gravity×content (%) of ceramic filler)+(specific gravity×content (%) of composite oxide)]

As shown in table 2 of FIG. 4, when a predetermined composite oxide was added (Exemplary Embodiments 1-8) the dielectric loss was low at no greater than 3.5×10-4, and an improvement in loss characteristics was confirmed. Furthermore, even if the baking time was short at around 20 minutes, not only was it possible to achieve low dielectric loss, there was also little change in characteristics even if the baking time was lengthened, so there was less sensitivity to the baking conditions, and a material that was suitable for stable production was formed in which fluctuations in characteristics due to changes in the crystalline state which are frequent in crystallized glass were limited.

In contrast to this, when a composite oxide was not added (Comparative Example 1), not only was the dielectric loss high at $3.5 \times 10^{-4}$, there were also large fluctuations with respect to baking time, and it was confirmed that the material was not suitable for stable production.

In addition, even when a composite oxide was added, the results showed that if this was outside the scope of the present invention (Comparative Examples 2-6), then the dielectric loss in all cases was high at $3.5 \times 10^{-4}$ or greater, there were also large changes in characteristics according to baking time, and there were concerns regarding increased variation in terms of product characteristics.

Exemplary Embodiment 9 and Comparative Example 7

A glass powder (crystallized glass powder on which was deposited a diopside comprising $SiO_2=50$ mass %, $CaO=19$ mass %, $MgO=22$ mass %, $Al_2O_3=1$ mass %, $CuO=0.05$ mass %, $SrO=8$ mass %), an alumina filler (mean particle size 2.5 µm), and composite oxide powders obtained in Production Example 1 were prepared, and glass ceramic sintered compacts were produced and evaluated using the same method as in Exemplary Embodiment 1, except that each of the materials was weighed out in such a way that the compositional ratio of each sample reached the values shown in table 3. The results are shown in table 3.

As shown in table 3 of FIG. 5, the same trend as above was apparent when the crystallized glass had the same crystal system, even if crystallized glass having a different composition was used. That is to say, an improvement in dielectric loss was confirmed when a predetermined composite oxide was added (Exemplary Embodiment 9).

Exemplary Embodiment 10

[Preparation of Glass Ceramic Wiring Board]

A glass powder (crystallized glass powder on which was deposited a diopside comprising $SiO_2=50$ mass %, $CaO=19$ mass %, $MgO=22$ mass %, $Al_2O_3=1$ mass %, $CuO=0.05$ mass %, $SrO=8$ mass %), an alumina filler (mean particle size 2.5 µm), and composite oxide powders obtained in Production Example 1 were prepared, and each of the materials was weighed out in such a way that the compositional ratio reached the values shown in Exemplary Embodiment 9 in table 3.

19.4 g of acrylic resin, 59.1 g of toluene, 3 g of ethanol, and 6.5 g of a plasticizer (butyl phthalyl butyl glycolate) were then mixed in order to prepare an organic vehicle.

The glass powder, alumina filler and predetermined composite oxide powders which had been weighed out, and the organic vehicle prepared were then combined and mixed for 24 hours using a ball mill in order to prepare paints for a green sheet for a substrate.

The paints for a green sheet for a substrate which had been prepared were formed as films by means of a doctor blade process on a polyethylene terephthalate film in order to form a plurality of green sheets for a substrate. It should be noted that the thickness of the green sheets was regulated in such a way as to reach 25 µm after baking.

After this, surface-layer conductor patterns (surface conductor pattern and mounting surface-terminal pattern) commensurate with the required circuit were formed by means of screen printing on a surface-layer green sheet. It should be noted that in this exemplary embodiment, the surface conductor pattern and the mounting surface-terminal pattern were formed by printing a silver paste in a predetermined pattern on the green sheet for a substrate disposed on the outermost side.

Furthermore, inner-layer conductor patterns (internal conductor pattern and via conductor pattern etc.) were also formed by means of screen printing in accordance with the required circuit for green sheets other than the surface-layer green sheet. It should be noted that according to this exemplary embodiment, the via conductor pattern was formed by forming through-holes (via holes) at predetermined positions in the green sheets for a substrate, and filling these holes with silver paste. Furthermore, the internal conductor pattern was formed by printing silver paste in a predetermined pattern on the surface of the green sheet for a substrate constituting the inner layer.

These green sheets were then stacked in a predetermined order, after which the stack was pressed at 74 MPa and baked for 2 hours at 900° C. under the atmosphere, and a glass ceramic wiring board 101 having a multilayer structure comprising the via conductor 3, surface terminal 4, internal conductor 5 and surface conductor 6 for which the cross-sectional structure is shown in FIG. 1 was obtained.

It should be noted that the total thickness of the glass ceramic wiring board after baking was 0.20 mm, and the thickness of the top surface-layer portion formed by the surface conductor 6 was 25 µm. After this, nickel was formed as a base on the surface conductor, after which gold plating was applied.

The glass ceramic wiring board obtained in this way had low dielectric loss in the high-frequency region, and it was confirmed that baking could be carried out at a low temperature of 1000° C. or less using a low-resistance metal such as Ag as a conductor layer.

INDUSTRIAL APPLICABILITY

The present invention makes it possible to provide a glass ceramic sintered compact in which lower loss is achieved to enable use in a high-frequency region such as the milliwave region, while there is also little variation in characteristics, and also to provide a wiring board comprising such a glass ceramic sintered compact.

KEY TO SYMBOLS

1 . . . Glass ceramic sintered compact
1a-1d . . . Insulating layer
3 . . . Via conductor
4 . . . Mounting surface-terminal
5 . . . Internal conductor layer
6 . . . Surface conductor layer
10 . . . Green sheet
11a-11d . . . Green sheet for glass ceramic wiring board
12a-12d . . . Green sheet for glass ceramic substrate
13 . . . Via conductor pattern
14 . . . Mounting surface-terminal pattern
15 . . . Internal conductor pattern
16 . . . Surface conductor pattern
21 . . . Stack for glass ceramic wiring board
22 . . . Stack for glass ceramic substrate
101 . . . Glass ceramic wiring board
102 . . . Glass ceramic substrate

The invention claimed is:

1. A glass ceramic sintered compact containing a glass component, a ceramic filler and a composite oxide, wherein the glass component is crystallized glass on which is deposited a diopside oxide crystal phase comprising at least Mg, Ca and Si; and the composite oxide comprises at least Al and Co.

2. The glass ceramic sintered compact according to claim 1, wherein the composite oxide further comprises Ti.

3. The glass ceramic sintered compact according to claim 1 or 2, wherein the content of said composite oxide is 0.05-1.5 mass % in terms of oxide equivalent.

4. The glass ceramic sintered compact according to any of claims 1 to 3, wherein the ceramic filler is $Al_2O_3$.

5. A wiring board comprising an insulating base and a wiring conductor, wherein the insulating base comprises the glass ceramic sintered compact according to any of claims 1 to 4.

\* \* \* \* \*